United States Patent
Huffaker et al.

(10) Patent No.: US 8,410,523 B2
(45) Date of Patent: Apr. 2, 2013

(54) MISFIT DISLOCATION FORMING INTERFACIAL SELF-ASSEMBLY FOR GROWTH OF HIGHLY-MISMATCHED III-SB ALLOYS

(76) Inventors: Diana L. Huffaker, Albuquerque, NM (US); Larry R. Dawson, Albuquerque, NM (US); Ganesh Balakrishnan, Albuquerque, NM (US)

( * ) Notice: Subject to any disclaimer, the term of this patent is extended or adjusted under 35 U.S.C. 154(b) by 551 days.

(21) Appl. No.: 12/332,014

(22) Filed: Dec. 10, 2008

(65) Prior Publication Data
US 2010/0051900 A1 Mar. 4, 2010

Related U.S. Application Data

(63) Continuation-in-part of application No. 11/622,262, filed on Jan. 11, 2007, now abandoned.

(60) Provisional application No. 60/757,870, filed on Jan. 11, 2006, provisional application No. 60/801,077, filed on May 18, 2006.

(51) Int. Cl.
*H01L 21/02* (2006.01)

(52) U.S. Cl. ............. 257/190; 257/12; 257/13; 257/14; 257/80; 257/83; 257/94; 257/98; 257/103; 257/200; 257/201; 257/615; 257/E21.097; 257/E21.098; 257/E21.108; 257/E21.109; 257/E21.112; 257/E21.125; 257/E21.126; 257/E21.127

(58) Field of Classification Search .............. 257/200, 257/201, 615, E21.097, E21.098, E21.108, 257/E21.109, E21.112, E21.126, E21.127, 257/12, 13, 14, 80, 83, 94, 98, 103, 190, 257/E21.125

See application file for complete search history.

(56) References Cited

U.S. PATENT DOCUMENTS

| | | | |
|---|---|---|---|
| 6,680,495 B2 * | 1/2004 | Fitzergald | 257/183 |
| 2003/0213950 A1 | 11/2003 | Hwang | |
| 2007/0212879 A1 | 9/2007 | Grasby et al. | |

OTHER PUBLICATIONS

Huffaker et al., "Monolithic Integration of Sb-based Photopumped Lasers on Si", 2nd IEEE International Conference on Group IV Photonics, 2005, pp. 149-150.
Mori et al., "Growth temperature effect on the heteroepitaxy of InSb films on a Si(001) substrate covered with Ge islands", Thin Solid Films 333, 1998, pp. 60-64.

* cited by examiner

*Primary Examiner* — Jay C Kim
(74) *Attorney, Agent, or Firm* — MH2 Technology Law Group, LLP

(57) ABSTRACT

Exemplary embodiments provide high-quality layered semiconductor devices and methods for their fabrication. The high-quality layered semiconductor device can be formed in planar with low defect densities and with strain relieved through a plurality of arrays of misfit dislocations formed at the interface of highly lattice-mismatched layers of the device. The high-quality layered semiconductor device can be formed using various materials systems and can be incorporated into various opto-electronic and electronic devices. In an exemplary embodiment, an emitter device can include monolithic quantum well (QW) lasers directly disposed on a SOI or silicon substrate for waveguide coupled integration. In another exemplary embodiment, a superlattice (SL) photodetector and its focal plane array can include a III-Sb active region formed over a large GaAs substrate using SLS technologies.

8 Claims, 6 Drawing Sheets

MISFIT DISLOCATION FORMING INTERFACIAL SELF-ASSEMBLY FOR GROWTH OF HIGHLY-MISMATCHED III-SB ALLOYS

RELATED APPLICATIONS

This application is a continuation-in-part of U.S. patent application Ser. No. 11/622,262, entitled "Misfit Dislocation Forming Interfacial Self-Assembly for Growth of Highly Mismatched III-Sb Alloys," filed Jan. 11, 2007, now abandoned which is hereby incorporated by reference in its entirety, which claims priority from U.S. Provisional Patent Applications Ser. No. 60/757,870, filed Jan. 11, 2006, and Ser. No. 60/801,077, filed May 18, 2006, which are also hereby incorporated by reference in their entirety.

GOVERNMENT RIGHTS

This invention was made with Government support under Grant No. W911NF-05-1-0225 awarded by the Defense Advanced Research Projects Agency/Army Research Office, and Contract No. FA9550-05-1-0419 awarded by the Air Force Office of Scientific Research. The government has certain rights in the invention.

DESCRIPTION OF THE INVENTION

1. Field of the Invention

This invention relates generally to semiconductor devices and fabrication processes and, more particularly, to semiconductor devices with lattice-mismatched layers.

2. Background of the Invention

In material science, and particularly, in the field of microelectronics, a layered semiconductor device is often used for functional structures and/or active devices. For example, a layered semiconductor device including group III-V layers integrated with silicon substrates can be used for a wide variety of opto-electronic and electronic devices. During formation of a layered semiconductor device, if there is no difference in lattice parameter (i.e., no lattice mismatch) between, for example, the substrate and the semiconductor layer formed thereon, the semiconductor layer can be formed with desired thicknesses. That means, the layered semiconductor device can be fully relaxed and exhibit low defect densities.

Problems arise, however, if there is a difference in the lattice parameter (i.e., lattice mismatch) between the substrate and the semiconductor layer formed thereon. A high density of dislocations can be formed within the plane of mismatch, because of the strain generated by the difference of lattice parameters. Typically, the dislocations are characterized as either threading or misfit dislocations. For example, the misfit dislocations start to appear as soon as the mismatched semiconductor layer reaches a critical thickness. Thus, the formation of the misfit dislocations limits the growth of the mismatched semiconductor layer on the substrate. Moreover, the misfit dislocations can accommodate some of the lattice mismatch and thus relieve the strain, which can result in cracks and high dislocation density in the mismatched semiconductor layer. Further, with subsequent growth, these misfit dislocations can give a way to threading dislocations, which are highly detrimental to the functioning of opto-electronic devices, for example.

Thus, there is a need to overcome these and other problems of the prior art and to provide devices and methods to form lattice-mismatched layered semiconductor devices with low defect densities and which are strain relieved. It is further desirable to incorporate the layered semiconductor devices into active devices for specific applications.

SUMMARY OF THE INVENTION

According to various embodiments, the present teachings include an emitter device, which can include a semiconductor substrate; a lattice mismatched first doped layer disposed on the semiconductor substrate; an active region disposed over the first doped layer; and a second doped layer disposed over the active region. The first doped layer can have a defect density of about $10^6$ cm$^{-2}$ or less and a strain relief of about 98% or higher and the active region can be proximate to a waveguide material of the semiconductor substrate.

According to various embodiments, the present teachings also include a superlattice (SL) Sb-based detector. The SL Sb-based detector can include a focal plane array (FPA) that has a GaAs substrate and a plurality of photodetectors on the GaAs substrate. Each photodetector of the plurality of photodetectors can include a high quality buffer layer formed on the GaAs substrate through a plurality of arrays of misfit dislocations and a SLS (spring loaded socket) active region formed on the high quality buffer layer.

According to various embodiments, the present teachings further include a method for forming a semiconductor Sb-alloy. During the formation of the semiconductor Sb-alloy, a substrate can first be selected to provide a mismatched lattice with an Sb-atom by about 3% or higher. A surface of the selected substrate can then be prepared and exposed to a III-Sb material to form a plurality of arrays of Sb-based misfit dislocations on the prepared substrate surface. The III-Sb alloy can be formed by continuing the growth of the III-Sb material through the plurality of arrays of Sb-based misfit dislocations on the prepared substrate surface.

According to various embodiments, the present teachings further include a method for forming an emitter device. In this method, a first doped layer can be formed over a semiconductor substrate through a plurality of Sb-based arrays of misfit dislocations. The semiconductor substrate can include a waveguide material. The first doped layer can be lattice mismatched with the semiconductor substrate and can have a defect density of about $10^6$ cm$^{-2}$ or less and a strain relief of about 98% or higher. An active region can then be formed over the first doped layer and can be in proximate to the waveguide material of the semiconductor substrate. The emitter device can be formed by further forming a second doped layer over the active region.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
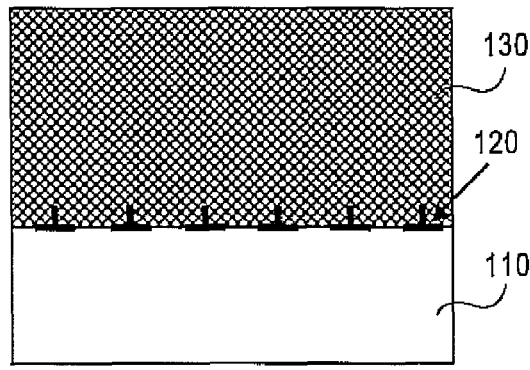
FIG. 1 depicts an exemplary high-quality layered semiconductor device in accordance with the present teachings.

Reference will now be made in detail to the present embodiments (exemplary embodiments) of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide high-quality layered semiconductor devices including highly lattice-mismatched layers and methods for their fabrication. The high-quality layered semiconductor device can be formed in plane with low defect densities and be strain relieved. For example, the high-quality layered semiconductor devices can provide a defect density of about $10^6$ $cm^{-2}$ or less and a strain relief of about 98% or higher. The high-quality layered devices can include semiconductor layers with highly mismatched lattices. As used herein, the term "highly mismatched lattices" refers to lattice parameters for two adjacent layers (e.g., an epilayer on a substrate or one epilayer on another epilayer) of the layered semiconductor device that are mismatched by about 3% or more, where a strain including a compressive and/or a tensile strain can be generated. The degree of the lattice mismatch can be calculated by methods known to one of ordinary skill in the art.

The high-quality layered semiconductor device can include a plurality of arrays of misfit dislocations (also referred to herein as "interfacial self-assembly") at the interface between the highly (lattice) mismatched semiconductor layers, where a strain including a compressive and/or a tensile strain can be generated. In various embodiments, the plurality of arrays of misfit dislocations can be a network of misfit dislocations, which can include semiconductor species (ad-species) assembled at the mismatched interface. In various embodiments, the plurality of arrays of misfit dislocations can be laterally propagated (i.e., 90° from the surface normal) on the entire surfaces of the semiconductor layers, i.e., at the entire mismatched interface, to release the strain energy. In addition, the plurality of arrays of misfit dislocations can be periodic and uniform. In various embodiments, the formation of the plurality of arrays of misfit dislocations can be affected and controlled by, for example, the type and the amount of the ad-species presented on the mismatched interface, and the growth parameters involved, which can vary from material system to material system in accordance with the present teachings.

In various embodiments, the high-quality layered semiconductor device can be formed in whole wafer or in selective regions of a wafer defined through methods such as physical masks or etching process known to one of ordinary skill in the art. The high-quality layered semiconductor device can be formed by a variety of crystal growth (i.e., epitaxy) methods including, but not limited to, metal-organic chemical vapor deposition (MOCVD), molecular-beam epitaxy (MBE), gas source MBE (GSMBE), metal-organic MBE (MOMBE), atomic layer epitaxy (ALE), hydride vapor phase epitaxy (HVPE), or organometallic vapor phase epitaxy (OMVPE). In various embodiments, the high-quality layered semiconductor device can be formed by highly engineered processes, which can vary from material system to material system.

In various embodiments, the layered semiconductor device can include one or more materials selected from the group consisting of materials systems of group III-V, II-VI, VI, III and/or IV. For example, III-V materials system such as semiconductor alloy compositions can be used for the disclosed layered device. In this materials system, examples of the group III elements can include Ga, In or Al, which can be formed from exemplary respective group III precursors, such as trimethylgallium (TMGa) or triethylgallium (TEGa), trimethylindium (TMIn) or trimethylaluminum (TMAl). In the III-V materials system, exemplary group V elements can include As, Sb, N, or P. Exemplary group V precursors, such as ammonia, tertiarybutylphoshine (TBP), or arsine ($AsH_3$) can be used to provide according exemplary elements such as N, P or As.

In the following description, semiconductor alloy compositions can be described by the combination of elements, such as, for example, GaSb, InSb, GaAs, InP, GaN, InAs, AlAs, AlGaAs, AlGaSb, or InGaSb. Generally, the elements in a composition can be combined with various molar fractions. For example, the semiconductor alloy composition InGaSb can stand for $In_{(x)}Ga_{(1-x)}Sb$, where the molar fraction, x, can be any number less than 1.00.

FIG. 1 depicts an exemplary high-quality layered semiconductor device 100 in accordance with the present teachings. It should be readily apparent to one of ordinary skill in the art that the device 100 depicted in FIG. 1 represents a generalized schematic illustration and that other layers/arrays can be added or existing layers/arrays can be removed or modified.

As illustrated in FIG. 1, the high-quality layered device 100 can include a first layer 110, a plurality of arrays of misfit dislocations 120, and a second layer 130. The second layer 130 can be disposed on the first layer 110 through the plurality of arrays of misfit dislocations 120, which can be disposed at the interface between the first layer 110 and the second layer 130. Specifically, the second layer 130 can be formed on the first layer 110 by first forming the plurality of arrays of misfit dislocations 120 on the surface of the first layer 110 and the plurality of arrays of misfit dislocations 120 can then continue to grow to form the second layer 130.

The high-quality layered device 100 can include the second layer 130 formed on the first layer 110 using material pairs that are highly lattice mismatched. For example, an exemplary second layer 130 having a very large semiconductor atom such as Sb can be formed on an exemplary first layer 110 having a small atom from such as InP. In another example, an exemplary second layer 130 having a very small atom such as N can be formed on an exemplary first layer 110 having a much larger atom such as GaAs or GaSb.

Accordingly, the high-quality layered device 100 including highly mismatched layers can include a single change in the lattice parameter between the second layer 130 and the first layer 110. In various embodiments, the material pairs for the single lattice parameter change can include one or more of III-Sb/silicon, III-Sb/GaSb, III-Sb/InSb, II-Sb/GaAs, III-Sb/InP, III-N/GaAs, III-N/GaSb, GaN/GaAs, InAs/GaAs, GaSb/GaAs, AlGaAs/GaSb, AlAs/GaAs, or InGaSb/InP, and vice versa. In some embodiments, the high-quality layered device 100 can include one or more materials selected by various lattice types, for example, the layered device can include material pairs of Zinc-blend/cubic lattices, or hexagonal-lattices/Zinc-blend.

In an exemplary embodiment, an intermediate layer, for example, a surfactant layer or a passivation layer, can be disposed between the highly lattice mismatched layers, i.e., between the first layer 110 and the second layer 130. In an example where a highly mismatched AlSb is grown on Si, a thin layer of Al can be formed on the Si surface to facilitate the Sb atom bond to the Si surface prior to forming the AlSb alloy.

In various embodiments, the high-quality layered device 100 can include one or more layers on the second layer 130 providing a plurality of changes of lattice parameters. That is, a plurality of arrays of misfit dislocations can be formed at every interface (i.e., switch) of two mismatched layers adjacent on another. In an exemplary embodiment, a high-quality epitaxial layered device can include three changes of lattice constants, where each change can include a plurality of arrays of misfit dislocations. For example, such growth process can involve a growth of AlSb on Si substrate followed by a growth of InSb on the AlSb, which can be followed by a growth of GaAs on the InSb.

In various embodiments, the growth degree can vary for each layer of the device 100 that includes the plurality of lattice parameter switches. For example, a complete-grown epilayer can be formed on one or more of complete-grown epilayers (i.e., with strain relieved about 98% or higher) and incomplete-grown epilayers over a substrate. In an exemplary embodiment, a complete-grown planar epilayer having a first lattice constant can be formed through a first plurality of arrays of misfit dislocations on an incomplete-grown epilayer having a second lattice constant formed through a second plurality of arrays of misfit dislocations on a substrate. Such exemplary layered device 100 can be used to grow relaxed islands for such as optoelectronics applications. For example, a complete-grown planar epilayer on an incomplete-grown epilayer can include one or more of a GaSb on a GaAs and/or an InGaSb on an InP.

Referring back to FIG. 1, the plurality of arrays of misfit dislocations 120 can be formed on the surface of the first layer 110 prior to continuing the growth form the second layer 130.

In various embodiments, the plurality of arrays of misfit dislocations 120 can be formed by nucleation from a high density of ad-species. The ad-species can have a significant contrast in the atomic size with the atoms constituting the underlying lattice of the first layer 110 (e.g., a substrate). In various embodiments, the nucleation of ad-species can include, for example, quantum dots or island structures (not illustrated) depending on the materials system used for the first layer 110, the plurality of arrays of misfit dislocations 120, and the second layer 130. A nucleation layer can then be formed by continuing the growth of the ad-species. For example, the nucleated ad-species can be grown to coalesce to form the nucleation layer, which can be planar, homogeneous, and defect free. The plurality of arrays of misfit dislocations 120 can thereafter be formed to increase the surface area of the ad-species' and provide strain relief. In addition, the plurality of arrays of misfit dislocations 120 can be periodic, uniform and laterally propagated (i.e., 90° from the surface normal) on the surface of the first layer 110.

In various embodiments, the formation of the plurality of arrays of misfit dislocations 120 (i.e., the interfacial self-assembly) can be controlled by controlling the ad-specie's with, for example, the residence time and the amount present on the sub-surface (i.e., the surface of the first layer 110), the surface mobility and/or the self-assembly capability. These factors can in turn be controlled through various growth techniques, various growth parameters and specific types of ad-atoms for the specific surfaces of the first layer 110.

In various embodiments, the high-quality layered semiconductor device 100 can include lattice-mismatched epitaxy of Sb-based alloys formed on various substrates, for example, group III-V substrates and/or cubic substrates. The Sb-based alloys, for example, III-Sb alloys, can be used in advanced optoelectronic devices including monolithically integrated lasers, detectors, solar cells and/or transistors.

Figure 2:
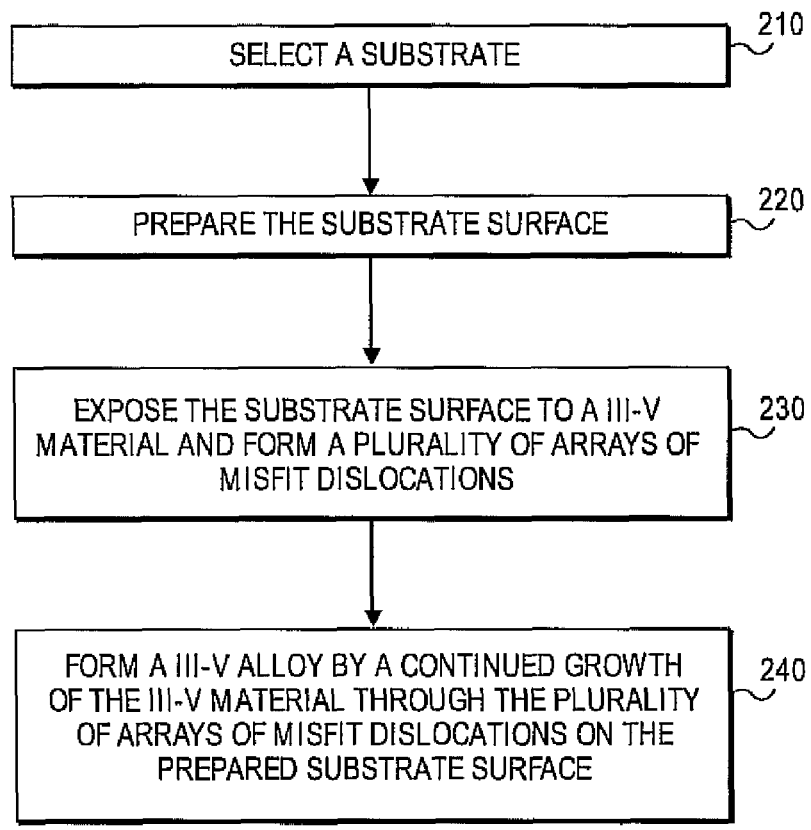
FIG. 2 depicts an exemplary process for forming high-quality III-Sb alloys on various substrates in accordance with the present teachings.

FIG. 2 depicts an exemplary process 200 for forming high-quality III-Sb alloys on various substrates in accordance with the present teachings. In particular, the highly mismatched III-Sb alloys can be grown planar with low defect densities and strain relieved through a plurality of arrays of Sb-based misfit dislocations.

As illustrated in FIG. 2, at 210, a substrate can be selected for the formation of the III-Sb alloys. Generally, in order to form planar III-Sb alloys with high-quality, the selected substrate can provide a highly mismatched lattice as compared with the III-Sb alloy, i.e., the atom Sb (antimony). For example, because Sb-atom as a group V element is considerably larger than the other group V elements, those other group V elements can be used as the substrates for the III-Sb alloys. That is, any non-Sb III-V material can be used as the substrate for the formation of high-quality III-Sb alloys. In addition, cubic substrates (e.g., silicon) with an atomic size considerably smaller than the Sb-atom can also be used as the substrate underlying the III-Sb alloys. In various embodiments, high-quality III-Sb alloys can also be formed on highly lattice mismatched antimonide substrates using specific fabrication processes. For example, high-quality III-Sb alloys can be formed on antimonide substrates such as GaSb or InSb.

In various embodiments, exemplary III-Sb alloys can include, but are not limited to, AlSb, GaSb, AlGaSb, and InGaSb, while exemplary substrates for the III-Sb alloys can include, but are not limited to, the group III-V substrates such as GaAs, InP, GaSb, or InSb, and cubic substrates such as silicon.

At 220, the selected substrate can be pretreated to provide a flat surface. In various embodiments, the substrate can be pretreated to provide an atomically flat surface. Depending on the material systems used, various methods can be used to pretreat the substrate surface for a high-quality growth of the III-Sb alloys. Exemplary pretreatments for specific substrates will be described later with respect to FIG. 3 and FIG. 4.

At 230, the pretreated substrate can be exposed to a III-Sb material forming a plurality of arrays of Sb-based misfit dislocations, which is also referred to herein as "interfacial Sb-self-assembly". The interfacial Sb-self-assembly can be formed due to the large contrast in lattice parameter that exists between the Sb atom and the atomic species that constitute the substrate. Thus, the Sb ad-atoms can be packed on the substrate lattice and form a network of misfit dislocations as the interfacial Sb-self-assembly. In various embodiments, the interfacial Sb-self-assembly (i.e., the plurality of arrays of Sb-based misfit dislocations) can be two dimensional, periodic and laterally (i.e., 90° to the normal of the substrate surface) propagated throughout the entire interface.

In various embodiments, the formation of the interfacial Sb-self-assembly can be affected by a variety of reaction factors, such as, for example, the III-V ratio, the Sb-atom flux, the surface residence time, and/or the growth temperature. For example, the III-V ratio can employ a critical role in the nucleation of the misfit dislocations due to the fact that the misfit forming atom (i.e., the ad-atom Sb) has to be present in majority on the surface of the substrate and also has to have sufficient time in organizing itself on the surface. In addition, the growth parameters can be modified for specific embodiments for optimal surface residence time and surface mobility for the atomic species. In various embodiments, the III-Sb material can have a III:Sb ratio of about 1:4 to about 1:10, for example, about 1:6, a Sb-atom flux of about $2 \times 10^6$ Sb-atom/cm$^2$, and a duration time of about 10 seconds or longer.

At 240, the III-Sb material can continue to grow forming a layer of III-Sb alloy through the interfacial Sb-self-assembly at the surface of the pretreated substrate. The III-Sb alloy can epitaxially grow with a wide range of thickness, for example, from about 10 Å to any desired thickness such as about 10 μm or higher. The III-Sb alloy can be in planar with low defect densities of, for example, about $6 \times 10^5$ cm$^{-2}$ or less and with a strain relief of, for example, about 98% or higher.

In various embodiments, the fabrication process for the high-quality III-Sb alloys can be controlled in a highly engineered manner depending on the material system used for both the III-Sb alloys and the underlying substrates. Exemplary formation processes for growing III-Sb alloys on a silicon substrate and a III-V substrate are illustrated in FIG. 3 and FIG. 4, respectively.

Figure 3:
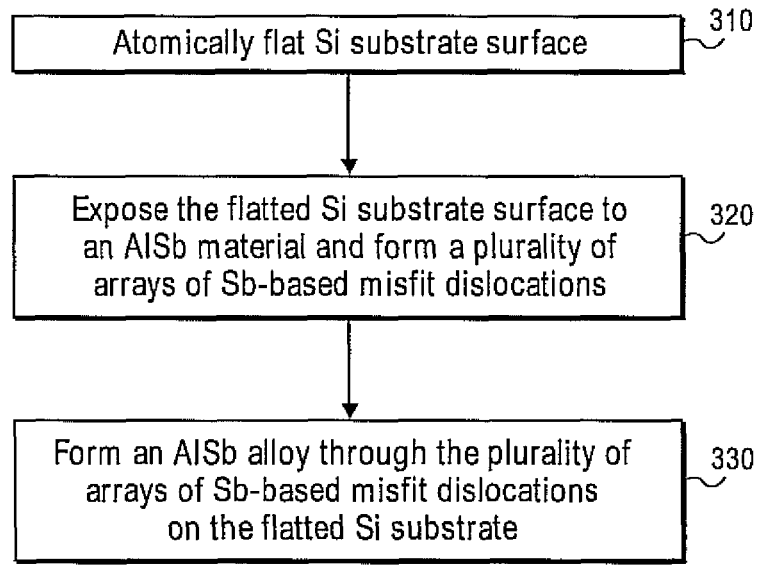
FIG. 3 depicts an exemplary method for forming high-quality III-Sb alloys on silicon substrates in according with the present teachings.
Figure 4:
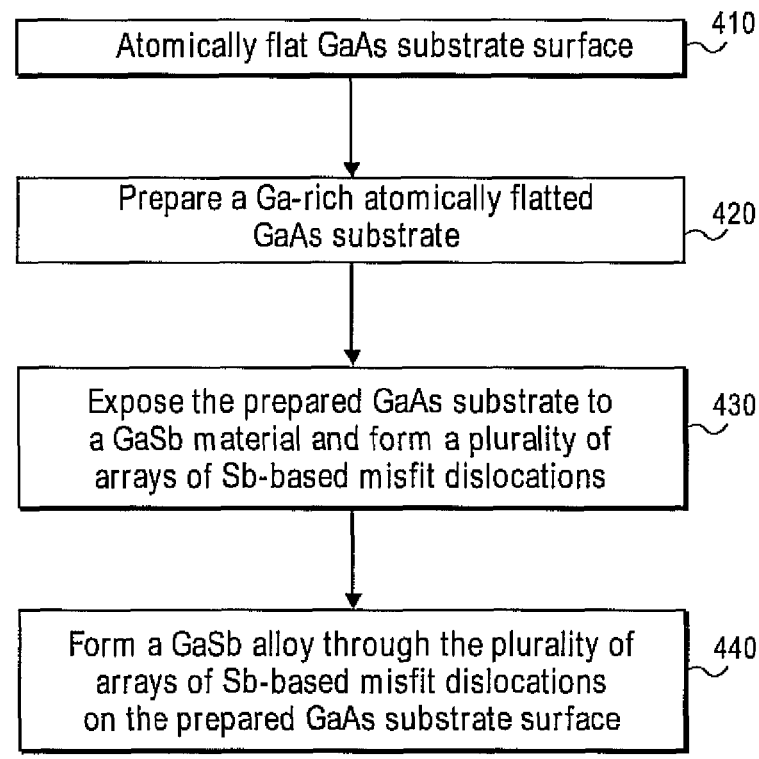
FIG. 4 depicts an exemplary method for forming high-quality III-Sb alloys on group III-V substrates in accordance with the present teachings.

FIG. 3 depicts an exemplary method 300 for forming high-quality III-Sb alloys on a silicon substrate in according with the present teachings. The high-quality III-Sb alloys on a silicon substrate can provide an integration of III-V materials with traditional CMOS technology. For example, a planar III-Sb alloy such as an AlSb layer can be grown on a silicon substrate to integrate III-Sb alloys with CMOS technology for electronic and/or opto-electronic applications, such as, VCSELs (vertical cavity surface emitting lasers) that can be electrically or optically pumped.

At 310, a silicon substrate can be selected and pretreated to be atomically flat. For example, the Si substrate can be prepared by immersion in hydro-fluoric acid to remove the possible oxide on the silicon surface and then passivating the surface with hydrogen, which can be subsequently removed by heating the substrate to, for example, about 500° C. in vacuum.

At 320, a plurality of arrays of Sb-based misfit dislocations, i.e., an interfacial Sb-self-assembly, can be formed on the surface of silicon substrate by exposing the pretreated silicon surface to a III-Sb material, for example, an AlSb material, in a crystal growth reactor (i.e., an epitaxial machine) such as an MBE machine or a MOCVD machine. Specifically, the pretreated silicon can be first soaked in a Sb-overpressure for about 5 minutes, for example. During formation, various methods/parameters can be controlled to facilitate the formation of the interfacial Sb-self-assembly and the subsequent high-quality AlSb alloys. For example, the pretreated silicon substrate can be exposed to the AlSb material, where Al and Sb can be deposited layer by layer, to enhance surface mobility. In another example, the AlSb material can be deposited with a high specific III:V ratio (i.e., Al:Sb ratio), for example, of about 1:4 to about 1:10. In a third example, an optimized growth temperature, for example, of about 510° C. to about 530° C., can be used for the growth of a high-quality AlSb alloy on the silicon substrate.

The interfacial Sb-self-assembly can then be formed on the surface of the silicon substrate, for example, by a self-arrangement of the larger Sb atom on the Si surface with an exemplary ratio of 13 antimony atoms per 14 Si sites. The formed interfacial Sb-self-assembly can be a 2D array of 90° misfit dislocations at the III-Sb/Si interface.

At 330, a high-quality III-Sb alloy (e.g., an AlSb alloy) can be formed in planar on the silicon substrate by a continuous epitaxial growth through the interfacial Sb-self-assembly. The exemplary AlSb alloy can be a smooth film formed in the growth reactor with low defect density of, for example, about $8 \times 10^5$ cm$^{-2}$ or less, and a strain relief of, for example, about 98% or higher. The thickness of the AlSb layer can be, for example, about 10 μm or higher.

FIG. 4 depicts an exemplary method 400 for forming high-quality III-Sb alloys on various group III-V substrates in accordance with the present teachings. For example, a GaSb alloy can be formed on a GaAs substrate in a MBE reactor.

As illustrated in FIG. 4, at 410, an atomically flat surface can be provided to the exemplary substrate GaAs. For example, a thin layer of GaAs can be formed onto the GaAs substrate surface. Specifically, the substrate GaAs can be pretreated by an exemplary homoepitaxial process, including first deoxidizing the surface at a temperature of such as about 600° C., and growing the layer of GaAs with a thickness of, for example, about 100 nm at a lower temperature (e.g., about 560° C.). In various embodiments, the GaAs substrate can also be pretreated by a polishing process, for example, a chemical mechanical planarization.

At 420, the atomically flatted substrate GaAs can be further prepared with rich Ga for the subsequent process. For example, the Ga-rich GaAs substrate can be obtained after the formation of the thin layer GaAs at 410 by cutting off the arsenic over-pressure but maintaining the Ga overpressure. The Ga-rich GaAs substrate can then be exposed to III-Sb materials. In various embodiments, various surface techniques, such as, for example, the use of surfactants and surface passivations, or a passage of current through samples, can be used to make the substrate prepared for the subsequent formation of a plurality of arrays of Sb-based misfit dislocations.

At 430, the plurality of arrays of Sb-based misfit dislocations can be formed by exposing the prepared Ga-rich GaAs substrate surface to an exemplary GaSb material. The plurality of arrays of misfit dislocations can be two dimensional, periodical and laterally (90° with respect to the surface normal) propagated on the prepared GaAs surface. Specifically, the Sb-atomic specie can bond to the dangling bonds on the substrate's top layer, which can result in an atomic bond that can be either very small or very large as compared to the substrate's bond length. Thus, the antimony can be reconstructed (i.e., packed) on the GaAs surface to form the plurality of arrays of Sb-based misfit dislocations. The reconstruction can be a self-assembled layer of Sb-atoms on the exemplary GaAs surface with Sb atoms bonding to every 13 consecutive Ga atoms and then skipping the $14^{th}$ Ga atom in order to achieve a strain free Sb layer on the GaAs surface. In some embodiments, the extent to the reconstruction can vary. In other embodiments, multiple reconstructed layers with various growth extents to the reconstruction can be used.

Various factors, for example, the degree of lattice mismatch and/or the growth parameters such as Sb overpressure, the growth temperature, and/or the reaction time, can be optimized to build the reconstruction and thus to form the plurality of arrays of Sb-based misfit dislocations. For example, the GaAs substrate surface can be exposed to the Sb atoms at a substrate temperature of about 510° C. to about 610° C., with a specific atom flux of about $2 \times 10^6$ mTorr and for a specific duration of time of about 10 seconds to several minutes. In a specific example, the growth temperature for GaSb can be optimized at about 520° C. to favor 90° propagated arrays of Sb-based misfit dislocations. In various embodiments, a pause process can be used after the exposure of the GaAs surface to the Sb material to facilitate the formation of the plurality of arrays of Sb-based misfit dislocations.

At 440, an exemplary GaSb layer can then be grown through the reconstructed Sb-layer, which results in smooth low-defect-density films. For example, the resulting GaSb layer can have a defect density of about $7 \times 10^5$ cm$^{-2}$ and a strain relief of about 98% or higher. The thickness of the GaSb layer can be, for example, from about 10 Å to a desired thickness such as 10 μm.

Figure 5:
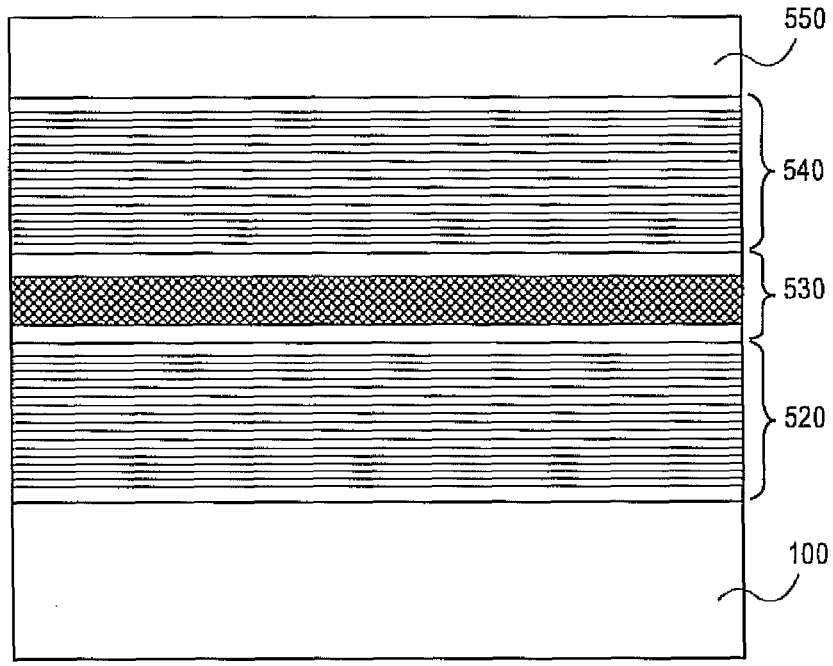
FIG. 5 depicts an exemplary monolithic vertical cavity device formed on the exemplary layered semiconductor device described in FIGS. 1-3 using a silicon substrate in accordance with the present teachings.
Figure 6:
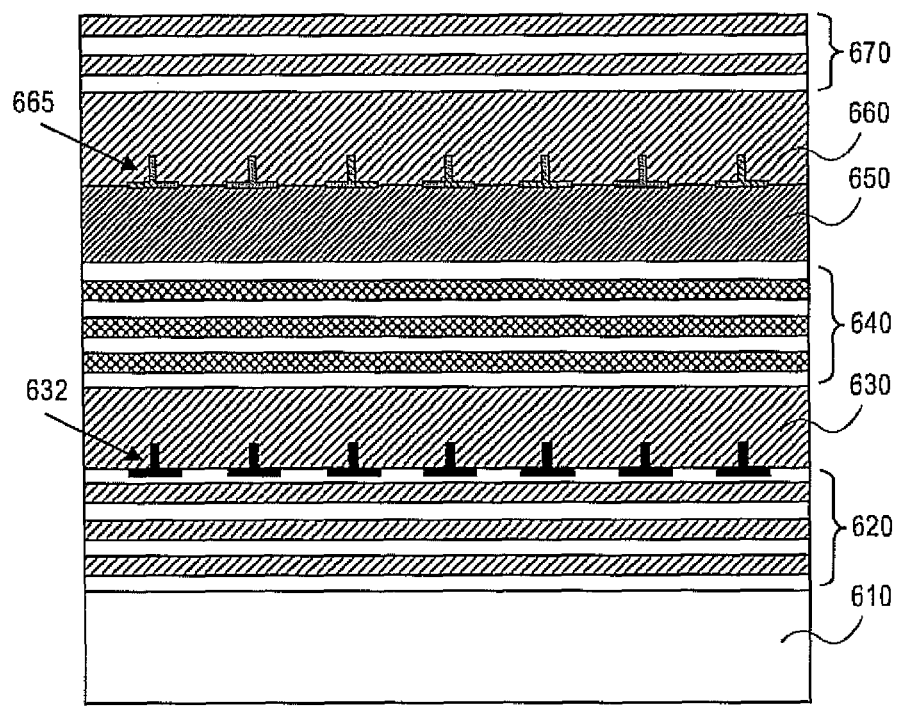
FIG. 6 depicts an exemplary vertical cavity device including two types of arrays of misfit dislocations formed on a group III-V substrate in accordance with the present teachings.

In various embodiments, various active devices, for example, vertical cavity devices such as VCSEL or VECSEL, can further be formed on the high-quality layered semiconductor device described in FIGS. 1-4. FIGS. 5-6 depict exemplary vertical cavity devices in accordance with the present teachings.

FIG. 5 depicts an exemplary monolithic VCSEL device 500 formed on an exemplary high-quality layered semiconductor device described in FIGS. 1-3 using a silicon substrate in accordance with the present teachings. It should be readily apparent to one of ordinary skill in the art that the device 500 depicted in FIG. 5 represents a generalized schematic illustration and that other layers can be added or existing layers can be removed or modified.

As shown, the device 500 can include stacked layers including a layered structure formed on an exemplary layered semiconductor device 100. The layered structure can further include a first distributed Bragg reflector DBR 520, an active region 530, a second distributed Bragg reflector DBR 540 and a cap layer 550. As illustrated in FIG. 5, the first DBR 520 can be formed on the exemplary device 100. The active region 530 can be disposed between the first and the second DBRs 520 and 540. The cap layer 550 can be formed on the second DBR 540.

The exemplary layered semiconductor device 100 (see FIG. 1) of the device 500 can include, for example, an AlSb nucleation layer with a thickness of such as about 50 Å on a silicon substrate (not shown) formed by the exemplary methods 200 and/or 300 as disclosed herein in FIGS. 2-3. The AlSb nucleation layer can be grown in planar on the silicon substrate by forming a plurality of arrays of Sb-based misfit dislocations, which can dissipate a majority of strain energy (e.g., greater than 98%) due to the high lattice-mismatch between the AlSb and the silicon substrate. The layered structure of the device 500 can then be formed thereon.

The first DBR 520 can be formed over the layered semiconductor device 100, more specifically, for example, over the planar AlSb nucleation layer. The first DBR 520 can include, for example, about 30 pairs of quarter-wave layers of AlSb on AlGaSb with an exemplary thickness of about 1197 Å and about 1013 Å, respectively. In various embodiments, a smoothing layer such as a GaSb layer can be formed between the exemplary planar AlSb nucleation layer of the layered semiconductor device 100 and the first DBR 520.

The active region 530 can be a multiple quantum well (MQW) active region for the device 500 formed over the first DBR 520. The active region 530 can include half-wave layers including alternating layers of a quantum well (QW) and a barrier layer. The active region QWs can include a material selected from the group consisting of GaSb, InGaSb, and AlGaSb. In an exemplary embodiment, the active region 530 of the device 500 can include about 6 pairs of GaSb QWs separated by, for example, AlSb barriers, where each of the GaSb quantum wells and the AlSb barriers can have an exemplary thickness of about 100 Å. In various embodiments, exemplary AlSb spacer layers can be formed before and after the MQW region.

The second DBR 540 can be formed over the active region 530. The second DBR 540 can include, for example, about 25 pairs of quarter-wave layers of such as AlSb on AlGaSb with an exemplary thickness of about 1197 Å and about 1013 Å, respectively. In various embodiments, the second DBR 540 can be an output coupler.

The cap layer 550 can be formed on the second DBR 540 to cap the device 500. The cap layer 550 can be used to prevent native oxidation of the Al-bearing layer, e.g., the AlSb spacer layer in the second DBR 540. The cap layer 550 can be, for example, a quarter-wave layer of GaSb with an exemplary thickness of such as about 975 Å.

As a result, the VCSEL device 500 can be monolithically-grown on the Si substrate with high-quality epilayers. The growth mode described herein can help effectively overcome the issue of mismatch that exists between III-V materials and silicon substrates, thus enabling to achieve III-V based devices on silicon. Specifically, the epilayers in the device 500 can have a defect density of, for example, less than about $8\times10^5$ cm$^{-2}$ with a threshold excitation density of, for example, about 0.24 mJ.cm$^{-2}$. In addition, the layered epimaterial in the VCSEL device 500 can, for example, be strain relieved greater than 98%. Further, the device 500 can be photo-pumped at, for example, about 1.65 nm and 2 nm at room temperature.

Various embodiments can also include a method for forming the disclosed monolithic VCSEL device as shown in FIG. 5. In one embodiment, a III-Sb alloy such as AlSb can be formed on a prepared silicon substrate as described in FIGS. 2-3, followed by forming the first distributed Bragg reflector (DBR) on the III-Sb alloy. The first DBR can include the plurality of quarter-wave layers, e.g., including AlSb and/or AlGaSb. Following the formation of the first DBR, the active region, e.g., including GaSb, InGaSb, AlGaSb, and/or AlSb, can be formed over the first DBR. The second DBR, e.g., including the plurality of quarter-wave layers of AlSb and/or AlGaSb, can then be formed over the active region to form the disclosed VCSEL device 500.

In various embodiments, various types of arrays of misfit dislocations can be used in an active device for specific applications. For example, various types of arrays of misfit dislocations can be used in vertical-cavity devices, allowing an embedded III-Sb quantum well active region in an III-As based system since these two materials system are highly lattice-mismatched. The III-As based system, for example, a GaAs material system possesses many attractive features that are now utilized in high performance, highly manufacturable near-IR devices.

The arrays of misfit dislocations can be formed under a compressive and/or a tensile strain conditions between two epilayers or between an epilayer and the underlying substrate. For example, the arrays of compressive misfit dislocations can be formed at interfaces such as InAlSb on GaAs or GaSb on GaAs. Exemplary arrays of tensile misfit dislocations can be formed at interfaces such as GaAs on InAlSb or GaAs on GaSb.

FIG. 6 depicts an exemplary vertical cavity device 600 including two types of arrays of misfit dislocations formed on a group III-V substrate in accordance with the present teachings. It should be readily apparent to one of ordinary skill in the art that the device 600 depicted in FIG. 6 represents a generalized schematic illustration and that other layers can be added or existing layers can be removed or modified.

In various embodiments, the device 600 can be a hybrid and monolithic device operating in a wide range of wavelength, for example, about 1.6 to 5.0 µm, where the exemplary III-Sb band gap can be used for mid-infrared access. In various embodiments, the device 600 can use the processing advantages of the III-As matrix (e.g., GaAs) in a monolithic vertical-cavity structure.

As illustrated in FIG. 6, the device 600 can include stacked layers including a substrate 610, a first DBR 620, a first doped layer 630, a first plurality of arrays of misfit dislocations 632, an active region 640, a second doped layer 650, a third doped layer 660, a second plurality of arrays of misfit dislocations 665 and a second DBR 670. The first plurality of arrays of misfit dislocation 632 can be formed at the interface between the first doped layer 630 and the first DBR 620. The second plurality of arrays of misfit dislocation 665 can be formed at the interface between the third doped layer 660 and the second doped layer 650.

The substrate 610 can be a III-V group substrate, for example, a III-As substrate such as a GaAs. The first DBR 620 can be formed over the substrate 610. The first DBR 620 can be a cladding layer formed of, for example, alternating layers of GaAs and AlGaAs such as Al$_{0.92}$Ga$_{0.08}$As, or GaAs and AlAs. In various embodiments, the first DBR 620 can be made an n-type cavity structure.

The first doped layer 630 can be formed directly on the first DBR 620. The first doped layer 630 can be highly lattice mismatched with the top surface of the first DBR 620. By forming the first plurality of arrays of misfit dislocations 632 at the interface between the first doped layer 630 and the first DBR 620, the first doped layer 630 can be formed in planar and with high-quality, i.e., with a low defect density and strain relieved. The first doped layer 630 can be formed of, for example, GaSb or InAlSb. The first doped layer 630 can be made an n-type cladding epilayer by doping with various impurities such as silicon, germanium, selenium, sulfur and tellurium. In various embodiments, the first doped layer 630 can be made a p-type layer by introducing, for example, beryllium, strontium, barium, zinc, or magnesium. Other dopants known to one of ordinary skill in the art can be used.

The active region 640 can be a MQW active region formed over the first doped layer 630. Depending on the materials incorporated into the active region 640, the device 600 can provide various properties. For example, a Sb-based active region such as a GaSb-based active region can emit in a wavelength of mid-IR such as about 1.5 µm to about 2 µm. In another example, indium can be included in the active region 640 to extend the emission wavelength to longer wavelengths, for example, for an InSb active region, the device 600 can be operated in a range of about 3.8 µm to about 5.0 µm. In various embodiments, the active region 640 can include MQW structures formed of, for example, alternating layers of GaSb and AlGaSb such as Al$_{0.3}$Ga$_{0.7}$Sb or InSb and InAlSb. In some embodiments, the active region 640 can be an InGaSb-based MQW, for example, with alternating layers of InGaSb and AlGaSb or InGaSb and GaSb.

The second doped layer 650 can also be included in the device 600 and formed over the active region 640. The second doped layer 650 can be a cladding layer with sufficient thickness to keep active elements within the active region 640. The thickness of the layer 650 can be, for example, about 500 nm to about 2000 nm. The second doped layer 650 can be formed of, for example, GaSb or InAlSb. In various embodiments, the second doped layer 650 can be doped with a conductivity type similar to the third doped layer 660.

The third doped layer 660 can be formed over the second doped layer 650. In various embodiments, the third doped layer 660 can be formed to introduce the second DBR 670. The third doped layer 660 can be formed of, for example, GaSb or AlGaAs. In various embodiments, the third doped layer 660 can have a highly mismatched lattice with the second doped layer 650. By forming the second plurality of the arrays of misfit dislocations 665 at the interface between the third doped layer 660 and the second doped layer 650, the third doped layer 660 can be formed in planar with a low defect density and strain relieved. In various embodiments, the third doped layer 660 can be a cladding layer doped to be an n-type or p-type. In various embodiments, if the first doped layer 630 is an n-type layer, the layer 650 and/or 660 can be a p-type layer and vice versa.

In various embodiments, the device 600 can include the second DBR 670 formed over the third doped layer 660. The second DBR 670 can be formed of, for example, alternating layers of GaAs and AlGaAs such as Al$_{0.92}$Ga$_{0.08}$As, or GaAs and AlAs. In various embodiments, the second DBR 670 can be made a p-type cavity structure.

In various embodiments, one of the first and the second plurality of arrays of misfit dislocations 632 and 665 can be formed under either compressive or tensile strain condition. For example, where an exemplary active region 640 is formed of the alternating layers of InSb/InAlSb (or GaSb/AlGaSb), the first doped layer 630 can be an InAlSb (or GaSb) cladding layer formed on an exemplary GaAs-based first DBR 620 through a formation of the first plurality of misfit dislocations 632 under a compressive strain condition. In another example in the device 600 where the second doped layer 650 is a cladding layer made of InAlSb (or GaSb), the third doped layer 660 can be a AlGaSb (or GaAs) formed through a formation of the second plurality of misfit dislocations 665 under a tensile strain condition.

Accordingly, by using the first and the second plurality of arrays of misfit dislocations 632 and 665, no buffer layers need to be added between the highly mismatched layers of the device 600, for example, between the first doped layer 630 and the first DBR 620, and between the third doped layer 660 and the second doped layer 650.

In various embodiments, a method for forming the vertical cavity device 600 can also be included according to the present teachings. For example, the device 600 can be formed by forming the first distributed Bragg reflector (DBR) over a III-As semiconductor substrate and preparing the top surface of the first DBR for forming highly lattice mismatched first doped layer thereover, through a first plurality of arrays of Sb-based misfit dislocations on the interface therebetween. The first doped layer can therefore have high-quality and the active region can be formed over the first doped layer. Over the active region, the second doped layer can be formed, followed by forming the third doped layer over the second doped layer that is highly mismatched with the third doped layer through a second plurality of arrays of Sb-based misfit dislocations. The second DBR can then be formed over the third doped layer. In various embodiments, the first DBR and the second DBR can include, e.g., GaAs, AlGaAs, and/or AlAs; the first, second and third doped layers can include, e.g., GaSb and/or InAlSb; and the active region can include, e.g., GaSb, AlGaSb, InSb, InAlSb, and/or InGaSb.

In various embodiments, electrodes and/or electrical contacts, for example, layered metal combinations, can be added to the exemplary device 600 using techniques known to one of ordinary skill in the art. In various embodiments, a plurality of $Al_xO_y$ confining layers can be formed in the device 600 for effective current injection and index guiding with a high wall plug efficiency. The plurality of $Al_xO_y$ confining layers can be formed by oxidation processes to convert AlGaAs layers to $Al_xO_y$, for example. In various embodiments, the device 600 can be operated at room temperature offering a wall-plug efficiency of more than, for example, about 50% and a CW output power level higher than, for example, about 1 W.

Various embodiments can also include, e.g., waveguide-coupled emitter devices. For example, the emitter device can be bufferless and can include monolithic quantum well (QW) lasers directly formed on a SOI (silicon-on-insulator) or silicon substrate for waveguide coupled integration. In an exemplary embodiment, the emitter device can include a close-proximity growth of InGaSb and InAs quantum wells on SOI wafers.

Figure 7:
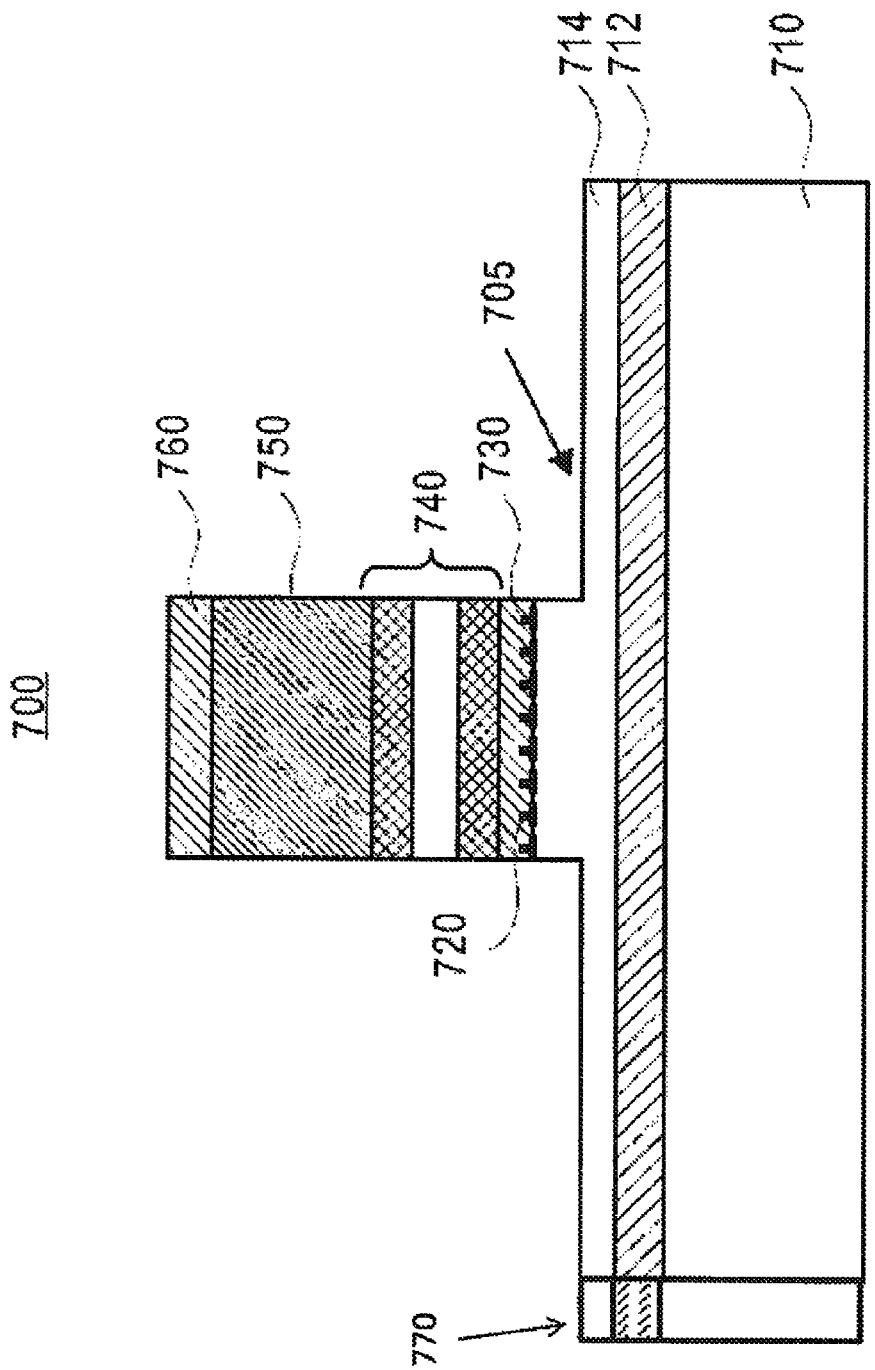
FIG. 7 depicts an exemplary emitter device in accordance with the present teachings.

FIG. 7 depicts an exemplary emitter device 700 using the disclosed arrays of misfit dislocations to form highly mismatched III-V epi-layers directly on an SOI (silicon-on-insulator) wafer using its insulator layer as a waveguide material in accordance with the present teachings. It should be readily apparent to one of ordinary skill in the art that the device 700 depicted in FIG. 7 represents a generalized schematic illustration and that other layers/components can be added or existing layers/components can be removed or modified.

As shown in the illustrated example, the device 700 can be a layered structure including a SOI substrate 705, or any other substrate from a fabrication process having a waveguide material, arrays of misfit dislocations 720, a first doped layer 730, an active region 740, a second doped layer 750, and a third doped layer 760.

In various embodiments, the arrays of misfit dislocations 720 can allow the first doped layer 730, such as a III-Sb layer, to be formed with high quality on the highly lattice mismatched silicon layer 714 of the exemplary SOI wafer 705. The disclosed 2-D array of 90° misfit dislocations 720 can serve to alleviate strain at the III-Sb/Si interface without the need for thick metamorphic buffers. The first doped layer 730 can thus be disposed between the SOI substrate 705 and the active region 740; and the second doped layer 750 can be disposed between the active region 740 and the third doped layer 760.

The SOI substrate 705 can include a silicon substrate 710 with an overlying oxide insulator layer 712 and an upper silicon structure 714. The upper silicon structure 714 can be a structure etched from the upper silicon layer of a conventional SOI wafer. The original upper silicon can be about 20.0 nm to about 50.0 nm thick above the oxide insulator layer 712 and can be etched to form any desired structures. As shown, the upper silicon structure 714 can include isolated island(s) or block(s) of silicon and silicon ends of the island(s) or block(s).

The first doped layer 730 can be formed directly on the silicon block 714. The first doped layer 730 can be highly lattice mismatched with the silicon block with no need to use thick metamorphic buffers due to the formation of arrays of misfit dislocations 720 at the interface between the first doped layer 730 and the silicon block 714. In various embodiments, the first doped layer 730 can be planar and formed with high-quality, i.e., with a low defect density and strain relieved. First doped layer 730 can be formed of, for example, any III-V material, such as GaSb or InAlSb. The first doped layer 730 can be made an n-type cladding epilayer by doping with various impurities such as silicon, germanium, selenium, sulfur and tellurium. In various embodiments, the first doped layer 730 can be made a p-type layer by introducing, for example, beryllium, strontium, barium, zinc, or magnesium. Other dopants known to one of ordinary skill in the art can be used.

The active region 740 can include a quantum well (QW) active region formed over the first doped layer 730. The active region 740 can include, III-V materials such as III-Sb material including, for example, GaSb, InGaSb, InSb, AlGaSb, or InAlSb. In various embodiments, the active region 740 can include QW structures formed of, for example, one or more layers or alternating layers of GaSb and AlGaSb such as $Al_{0.3}Ga_{0.7}Sb$, or InSb and InAlSb. In some embodiments, the active region 740 can be an InGaSb-based QW, for example, with one or more layers or alternating layers of InGaSb and AlGaSb or InGaSb and GaSb.

Because the III-Sb based active region can be formed directly on silicon, the device 700 can provide unique semiconductor laser-diode, for example, operating in the optical-communication wavelength range from about 1.3 mm to about 1.55 mm. In various embodiments, the active region 740 can be formed in close proximity to a waveguide material of the semiconductor substrate. For example, the oxide insulator layer 712 can be the waveguide material, from the exemplary SOI substrate 705.

The second doped layer 750 can be formed over the active region 740. The second doped layer 750 can be a cladding layer with sufficient thickness to keep active elements within the active region 740. The thickness of the layer 750 can be, for example, about 1 to about 3 μm. The second doped layer 750 can be formed of, for example, GaSb, InGaSb, InSb, AlGaSb, or InAlSb. In various embodiments, the second doped layer 750 can be doped with a conductivity type similar to the third doped layer 760.

The third doped layer 760 can be formed over the second doped layer 750. The third doped layer 760 can be formed of, for example, GaSb, InGaSb, InSb, AlGaSb, or InAlSb. In various embodiments, the third doped layer 760 can be a cladding layer doped to be an n-type or p-type. In various embodiments, if the first doped layer 730 is an n-type layer, the second doped layer 750 and/or the third doped layer 760 can be a p-type layer and vice versa.

In various embodiments, the device 700 can be formed by forming III-V layers over a conventional SOI wafer, followed by an etching process of the III-V layers and the upper silicon layer of the conventional SOI wafer. The formation of III-V layers and the etching process can be conducted using suitable techniques known to one of ordinary skill in the art.

In various embodiments, electrodes and/or electrical contacts, for example, layered metal combinations, can be added to the exemplary device 700 using techniques known to one of ordinary skill in the art to form, e.g., a semiconductor diode demonstrating communication wavelength lasing.

In various embodiments, the device 700 including layers of III-V semiconductors coupled into the $SiO_2$ waveguides of the SOI substrate can be used to form a transistor laser device. For example, a transistor gate structure (not shown) can be formed around the silicon blocks, with the ends of the silicon blocks being doped to form source/drains to form, e.g., CMOS based components. In this case, the QW laser active region 740 can be placed in a close proximity, e.g., about 1000 Å or less, to the $SiO_2$ insulator layer 712 on the silicon substrate 710 allowing the $SiO_2$ to guide the light produced by the integrated lasers into, for example, CMOS based photonic components 770 such as modulators and detectors for practical industry applications. Additionally, such close proximity can be important for transistors where the silicon oxide may act as a high quality insulator to confine the current.

It should be appreciated that, while device 700 have been described in conjunction with the SOI wafer, one of ordinary skill in the art would understand that other semiconductor substrates can be used. For example, the first doped layer 730 on the semiconductor substrate 705 can also include a material pair chosen from III-Sb/silicon, III-Sb/GaSb, III-Sb/InSb, III-Sb/GaAs, III-Sb/InP, III-N/GaAs, III-N/GaSb, GaN/GaAs, InAs/GaAs, GaSb/GaAs, AlGaAs/GaAs, AlAs/GaAs, InGaSb/InP, Zinc-blend/cubic lattices, and hexagonal-lattices/Zinc-blend.

Various embodiments can further include, for example, a III-Sb photodetector, such as a III-Sb superlattice (SL) infrared (IR) detector using SLS (i.e., spring loaded sockets) technologies. Focal plane arrays (FPAs) of the III-Sb photodetectors can also be included in various embodiments in accordance with the present teachings.

In the prior art, GaSb/InAs SLS technology is one of the most promising detector technologies for realizing room temperature (RT) uncooled operation in mid-wavelength infrared (MWIR) and Long-wavelength infrared (LWIR) and for fabricating detectors into focal plane arrays (FPAs). GaSb substrate technology is currently used to realize high performance FPAs, however such substrate technology is significantly less advanced than, for example, GaAs. For example, the GaSb substrate is limited to a 3" wafer at best with a high residual threading dislocation density of $\sim 10^4$ to $10^5$ defects/$cm^2$ and the substrate itself has a background doping level of $\sim 10^{17}/cm^3$ due to deep level traps in the material. These traps are over-active in the MWIR, making back illumination of the detectors very difficult. Also, making n-contact to the GaSb material is difficult. In addition to the GaSb substrate used for the SLS technology, research attempts have been focused on other III-V substrates, such as InAs substrate for IR detectors using SLS technology. Unfortunately, device designs are affected due to the heavy dopings of InAs.

Figure 8A:
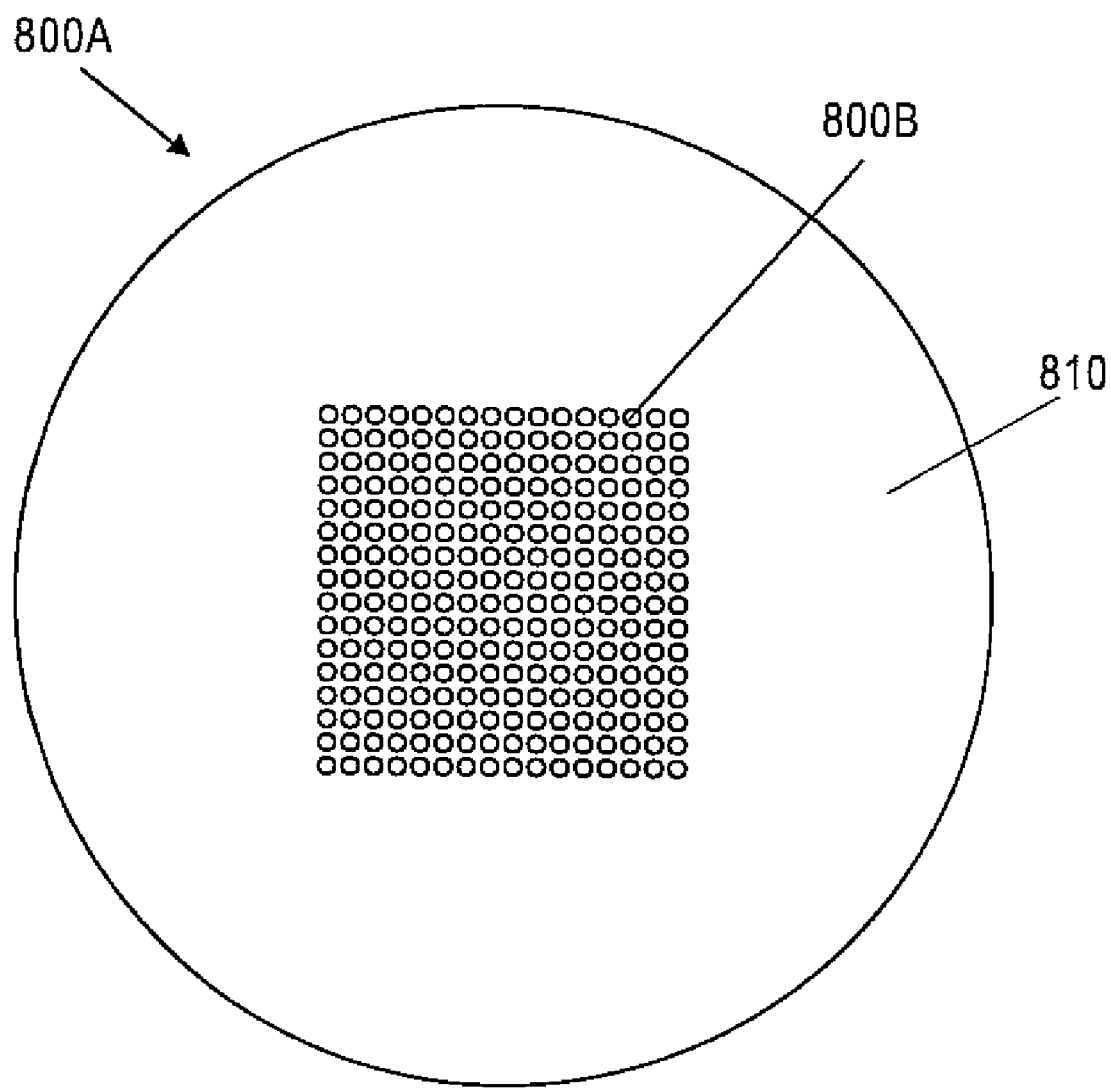
FIGS. 8A-8B depict an exemplary focal plane array (FPA) in accordance with the present teachings.
Figure 8B:
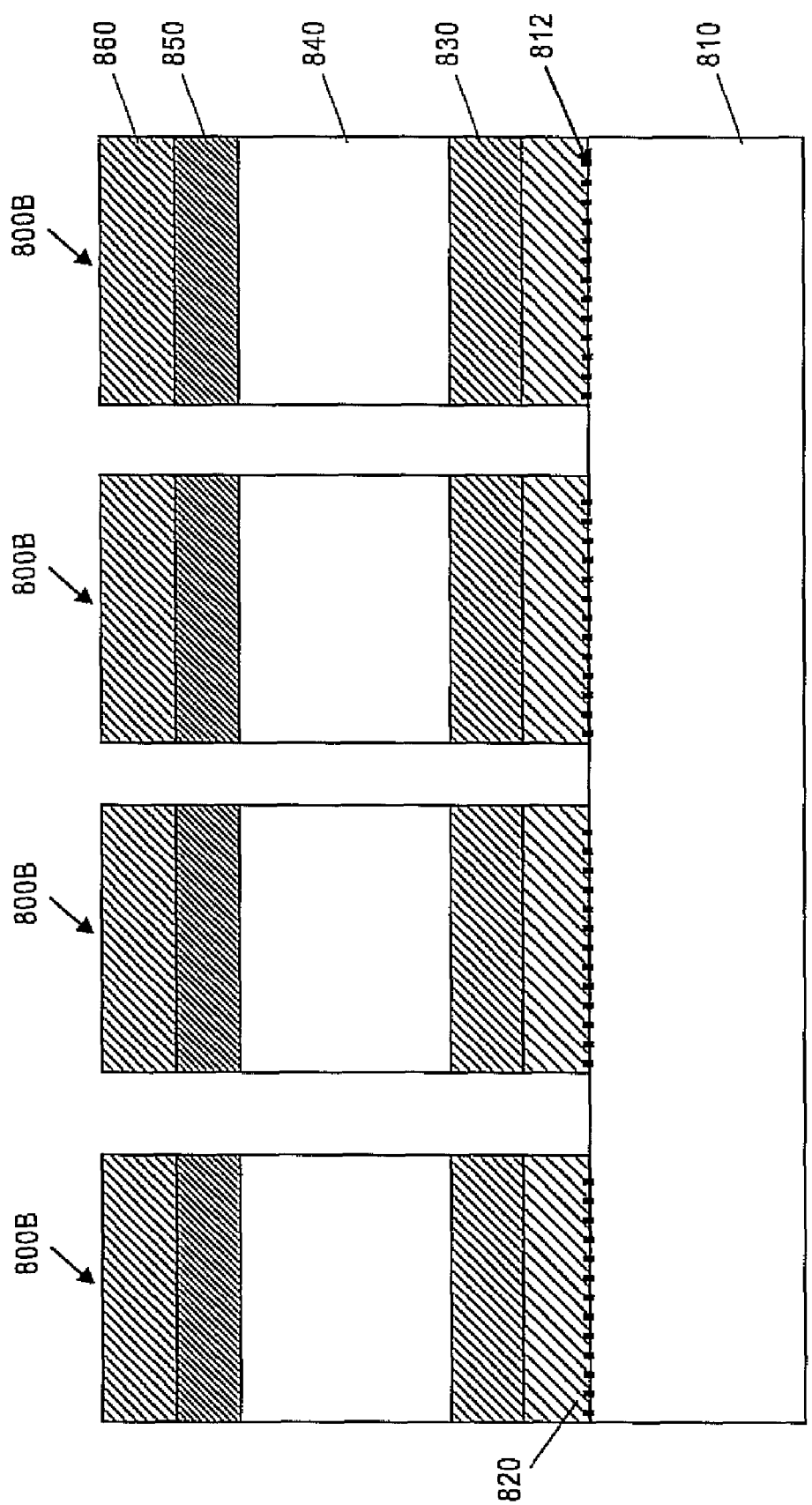

FIGS. 8A-8B depict an exemplary focal plane array (FPA) 800A in accordance with the present teachings. For example, the FPA 800A can include a desired number of III-Sb based photodetectors 800B on an exemplary GaAs substrate 810 by using the disclosed arrays of misfit dislocations to overcome the substrate issues in the prior art. It should be readily apparent to one of ordinary skill in the art that the devices depicted in FIGS. 8A-8B represent a generalized schematic illustration and that other layers/arrays/components can be added or existing layers/arrays/components can be removed or modified.

As shown in FIG. 8A, a plurality of III-Sb based photodetectors 800B can be formed on the exemplary GaAs substrate 810 to form the FPA 800A. In various embodiments, the FPA 800A can be a large area focal plane array (FPA).

As shown in FIG. 8B, each III-Sb based photodetector 800B can include stacks of heterostructure including the exemplary GaAs substrate 810, a buffer layer 820, a plurality of arrays of misfit dislocations 812, a first doped region 830, a SLS active region 840, a second doped region 850 and a third doped region 860.

The buffer layer 820 can include, for example, GaSb, InAs, (In)GaSb, or combinations thereof, and can be formed directly on the exemplary GaAs substrate 810 due to the formation of arrays of misfit dislocations 812 at the interface between the buffer layer 820 and the exemplary GaAs substrate 810 as disclosed herein. In various embodiments, the buffer layer 820 can include InAs/(In)GaSb type II strain layer superlattice absorbers.

In various embodiments, the exemplary GaSb buffer layer 820 formed on the GaAs substrate 810 though the growth of the interfacial misfit dislocations can be of high quality and with low defect density; and can be used to form desired III-Sb based photodetectors, e.g., on large GaAs substrates with a wafer diameter of about 3" or greater, such as, for example about 6". The larger detector wafers can allow for a higher yield from the disclosed growth process as well as the ability to fabricate larger FPAs. In addition, back-illumination in MWIR range can be performed through the transparent GaAs substrate, which makes the process simpler as compared with the conventional substrate materials used in the prior art. In various embodiments, disclosed detector/SLS technologies and their devices can be used for surveillance applications and for space applications.

Referring back to FIG. 8B, for each Sb-based photodetector 800B, the first doped region 830 can be formed on the buffer layer 820; the SLS active region 840 can be formed between the first and the second doped regions 830 and 850; and the third doped region 860 can be formed on the second doped region 850. In various embodiments, the first doped region 830, the second doped region 850 and the third doped region 860 in FIG. 8B can use the same or different materials, conductivities, or dopants as used for the first doped region 630/730, the second doped region 650/750 and the third doped region 660/760, respectively, as described in FIG. 6 or 7.

The SLS active region 840 can include, for example, III-V materials such as III-V material including, but not limited to, GaSb, InGaSb, InAs or combinations thereof. The SLS detectors can include, for example, alternating layers of InAs and (In)GaSb, which can form a type II band-alignment. The average bandgap of the type II material can be tuned by varying the thickness of the constituent InAs and (In)GaSb layers and thus constitutes the absorbing layer of the detector.

In an exemplary embodiment, each photodetector (see 800B) can include a GaAs substrate (see 810) with a diameter of about 3" or 6", overlaid with a high quality GaSb buffer layer (see 820) having a thickness of about 1 micron. On the high quality GaSb buffer layer (see 820), an n-doped superlattice (SL) layer (see 830) of InAs/(In)GaSb material having a thickness of about 500 nm can be formed. Overlaying the n-doped SL layer (see 830), a SLS active region (see 840) can be formed to have a thickness of about 2.5 microns. A p-doped SL layer (see 850) of InAs/(In)GaSb can then be formed on the SLS active region (see 840) having a thickness of about 100 nm for the p-doped SL layer (see 850). On this p-doped SL layer (see 850), a p-doped GaSb layer (see 860) having a thickness of about 50 nm can then be formed.

In various embodiments, electrodes and/or electrical contacts, for example, layered metal combinations, can be added to the each exemplary photodetector 800B using techniques known to one of ordinary skill in the art to form the Sb-based SL photodetectors and their FPAS using SLS technologies.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An emitter device comprising:
   a semiconductor substrate;
   a first doped layer disposed on the semiconductor substrate that is lattice mismatched with the semiconductor substrate;
   an active region disposed over the first doped layer, wherein the active region is proximate to a waveguide material of the semiconductor substrate;
   a second doped layer disposed over the active region; and
   a plurality of arrays of misfit dislocations laterally propagated throughout an interface between the first doped layer and the semiconductor substrate, wherein the plurality of arrays of misfit dislocations are operable to cause a density of lattice mismatched dislocation defects of about $10^6$ cm$^{-2}$ or less in the first doped layer and a lattice relaxation of about 98% or higher between the first doped layer and the semiconductor substrate, and wherein the semiconductor substrate comprises a silicon-on-insulator (SOI), wherein the active region is disposed at about 100 nm or less to a silicon oxide insulator layer of the SOI.

2. The device of claim 1, further comprising a transistor based photonic component, wherein the silicon oxide insulator layer guides a light produced by the active region into the transistor based photonic component.

3. The device of claim 1, wherein the active region comprises a quantum well active region comprising one or more materials selected from the group consisting of GaSb, in GaSb, InSb, AlGaSb, and InAlSb.

4. The device of claim 1, wherein the second doped layer comprises a conductivity type opposite to a conductivity type of the first doped layer.

5. The device of claim 1, wherein the second doped layer has a thickness ranging from about 0.1 to about 4 μm.

6. The device of claim 1, further comprising an operating optical-communication wavelength ranging from about 1.3 μm to about 1.55 μm.

7. The device of claim 1, wherein the first doped layer is lattice mismatched with the semiconductor substrate by 3% or higher.

8. The device of claim 1, wherein the first doped layer on the semiconductor substrate further comprises a material pair comprising a pair of III-Sb/silicon.

* * * * *